Figure 1:
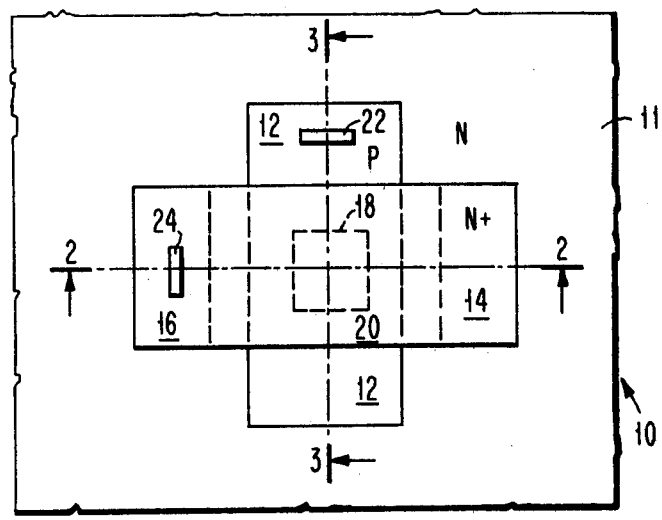

United States Patent [19]

Muggli

[11] 4,441,114

[45] Apr. 3, 1984

[54] CMOS SUBSURFACE BREAKDOWN ZENER DIODE

[75] Inventor: Raymond A. Muggli, San Jose, Calif.

[73] Assignee: International Business Machines, Armonk, N.Y.

[21] Appl. No.: 333,547

[22] Filed: Dec. 22, 1981

[51] Int. Cl.³ .......................................... H01L 29/90
[52] U.S. Cl. ........................................ 357/13; 357/20
[58] Field of Search .................... 357/13, 13 Z, 21, 20

[56] References Cited

U.S. PATENT DOCUMENTS

| | | | |
|---|---|---|---|
| 3,483,441 | 12/1969 | Hofflinger | 357/13 |
| 3,534,231 | 10/1970 | Biard | 357/13 |
| 3,584,266 | 6/1971 | Schilling | 357/13 |
| 3,663,874 | 5/1972 | Fukukawa et al. | 357/13 |
| 3,745,424 | 7/1973 | Ohuchi et al. | 357/13 |
| 3,881,179 | 4/1975 | Howard | 357/13 |
| 3,886,579 | 5/1975 | Ohuchi et al. | 357/13 |
| 4,079,402 | 3/1978 | Dunkley et al. | 357/13 |
| 4,127,932 | 12/1978 | Hartman et al. | 357/13 |
| 4,136,349 | 1/1979 | Tsang | 357/13 |
| 4,142,200 | 2/1979 | Mizushima et al. | 357/13 |
| 4,153,904 | 5/1979 | Tasch, Jr. et al. | 357/13 |
| 4,326,211 | 4/1982 | Smeets | 357/13 |
| 4,377,816 | 3/1983 | Sittig | 357/13 |

FOREIGN PATENT DOCUMENTS 54-6480  1/1979  Japan .

Primary Examiner—Martin H. Edlow
Assistant Examiner—Jerome Jackson
Attorney, Agent, or Firm—R. E. Cummins

[57] ABSTRACT

This zener diode is fabricated by a conventional CMOS device fabricating process whereby an entire electronic circuit can be laid down in one overall process. A semiconductor substrate of one conductivity type has an elongated deposit of semiconductor material of the opposite conductivity type diffused to a predetermined depth to form a well, centrally of which a deposit of enhanced semiconductor material of the same semiconductor conductivity type is diffused to a prearranged depth less than the predetermined depth. Semiconductor material of the one conductivity type is diffused into two elongated regions spaced apart from and on either side of the first elongated deposit while at the same time a quantity of the same material is diffused into the region between said two regions and over the centrally diffused region and doped more heavily than the substrate material to convert the upper part of the control diffusion to the opposite conductivity type for a substantial depth into the well whereby a p+n+ junction is formed completely beneath the surface of the substrate. One contact for the zener diode is made to the first diffusion region outside the converting diffusion region, to which the other contact is made.

6 Claims, 4 Drawing Figures

CMOS SUBSURFACE BREAKDOWN ZENER DIODE

FIELD

The invention relates to zener diode semiconductor devices, and it particularly pertains to such structures for incorporation in electronic circuitry laid down in Complimentary Metal Oxide Semi-conductor (CMOS) integrated circuit (IC) wafers and the like.

BACKGROUND

The term zener diode has long been applied to two-electrode semiconductor devices operating with respect to the phenomena of the breakdown in solid dielectrics below approximately (5) volts, and of the avalanche effect corresponding to the townsend discharge effect in dielectrics at potentials above approximately (5) volts. Zener diode devices are widely used as potential or "voltage" regulating devices, particularly in reference potential generating circuitry. Conventional IC devices very frequently include a number of zener diode devices, a number of transistor devices, and auxiliary circuit components and connections on a single semiconductor wafer or chip.

As the electronics arts have progressed, better and better zener diode devices and circuit arrangements have been developed. Examples of such improved zener diode circuits are found in the technical literature. There have been problems however with the prior art devices, for example, especially with respect to variations of the breakdown voltage, as a function of time and/or changes in temperature. It has been suggested that the causes of instability are related to the presence of the passivating insulating layer of silicon dioxide which lies adjacent to the silicon facing surface where avalanche breakdown takes place in the conventional zener diode devices. The prior art contains literature and patents that have proposed fabricating zener diode devices with subsurface avalanche breakdown regions, and to the extent that they are able, these prior art arrangements have proven successful. However, among the drawbacks of the present state of the art subsurface zener diodes are that an n+ diffusion into a p+ base results in a p pinch resistance that tends to a high dynamic impedance. Another drawback resides in considerable deformation damage due to diffusing a high emitter n+ concentration into a high p+ concentration resulting in problems in reliability and consequent reduction in yield.

PRIOR ART

Examples of pertinent prior art zener diode structures are disclosed in the following U.S. Pat. Nos.:
3,881,179 4/1975 Howard 357/13
4,079,402 3/1978 Dunkley et al. 357/13
4,136,349 1/1979 Tsang 357/13

In patents nos. of other countries:
54-6480 1/1979 Japan Oda

All of these patents are directed to zener diodes, and each teaches a structure wherein an avalanche breakdown in some respect occurs below the surface of a semiconductor device.

The patent to Howard is directed to such a structure wherein the breakdown is subsurface due to enhanced p diffusion under an n+ diffusion, but wherein there still is a pn junction at the surface over which there is an e field tending to ionize contaminants of that surface.

The patent to Dunkley and Solomon is directed to much the same structure, but wherein an ion implanted layer is arranged to establish the avalanche breakdown below the surface, and wherein there also is a portion of the pn-n junction at the facing surface. A pinch resistance component also exists resulting in a high dynamic impedance.

A lower dynamic impedance is provided by the structure taught by Tsang in his patent. This structure in fact has a part of the avalanche breakdown junction at the surface but this is hopefully nullified in effect by a shallow doping extending laterally of the junction to overcome the problem at least in part.

The Japanese patent appears to be the closest art. A zener diode having the p-n breakdown junction entirely beneath the facing surface is formed by first burying a subcollector layer in two epitaxial layer growing steps and diffusing semiconductor material of the same conductivity type from the facing surface to contact the subcollector after which material of the opposite conductivity type is diffused over the larger of the two like material diffusions to create a p-n breakdown junction beneath the facing surface of the structure. The anode and cathode connections are not made in the same manner as in the diode according to the invention because of structural differences.

SUMMARY

The objects of the invention referred to indirectly hereinbefore, and those that will appear as the specification progresses, are attained in a zener diode device fabricated by a conventional multilithic compatible metal oxide semiconductor devices fabricating process for producing a subsurface breakdown zener diode having a p-n avalanche breakdown junction formed completely beneath the facing surface of the overall semiconductor chip or wafer. A semiconductor substrate of one semiconductor conductivity type has a deposit of semiconductor material of the opposite conductivity type in a generally elongated or rectangular area, which deposit penetrates the substrate to a predetermined depth. Centrally of this deposit is a deposit of material of the opposite conductivity, but enhanced, which central deposit penetrates to a prearranged depth of the order of two-thirds of the predetermined depth. Semiconductor material of the one conductivity type, but more heavily doped, is diffused into a pair of regions from the facing surface of the substrate to a depth of the order of the prearranged depth. These regions are generally elongated and arranged parallel to and spaced apart from the first deposit. Preferably these regions are shorter in length than the first deposit. Thereafter a quantity of the same material and same doping is deposited into the region between the latter two regions and over the centrally deposited material. This latter deposit is carried out to convert a portion of the first centrally located deposit to the opposite conductivity type for a substantial depth into the latter. This forms an avalanche breakdown p-n junction completely beneath the facing surface of the semiconductor wafer or chip. The operating output regions of the zener diode thus formed to which electric contact is to be made, comprise the first deposit region outside the converting region and one of the two regions delineating it, to which regions metallic electrodes are attached.

Diffusion and ion implantation processes are interchangeable in the making of a zener diode according to the invention. Likewise, the reversibility of conductivity type is applicable with the Zener diode according to the invention. Due to the well-known superiority of n-channel CMOS FET, the substrate more often will be of n-type for the one conductivity type and the opposite conductivity type will be p-type material, of course.

The key advantages of the zener diode structure according to the invention resides in compatability with CMOS fabrication techniques and the reduction of flicker noise and the slower reduction of stability with age, both due to the reduction in mobile surface charges. Also the zener diode structure according to the invention has a dynamic impedence characteristic sufficiently low that there is no need of any buffer circuitry.

The avalanche breakdown junction is the entirely contained subsurface contiguous area of the n+p+ junction whereby the current density is readily maintained at a better than safe value.

DRAWING

Figures 2, 3:
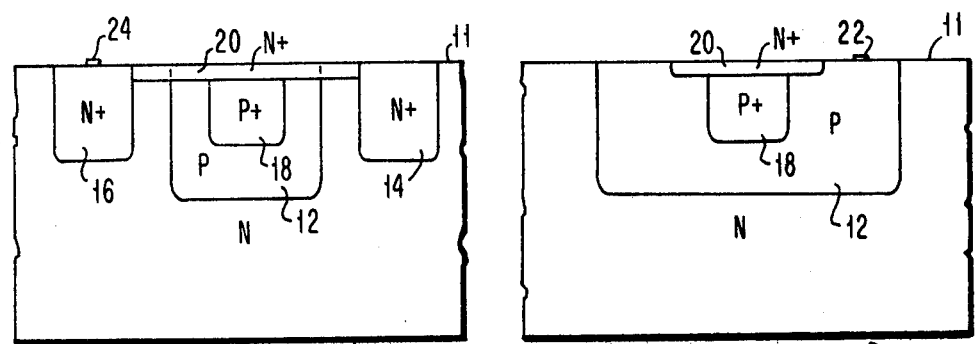
Figure 4:
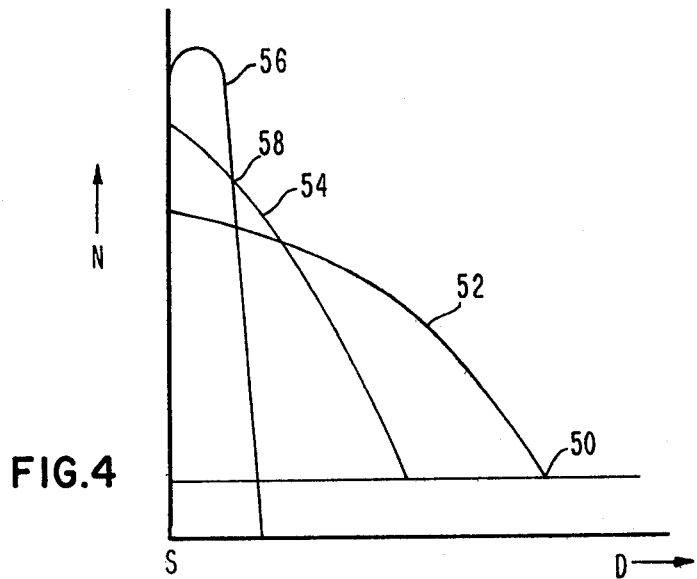

In order that full advantage of the zener diode according to the invention and the method for fabricating it obtain in practice, a preferred emobidment thereof, given by way of example only, is described in detail hereinafter with reference to the accompanying drawing, forming a part of the specification, and in which:

FIGS. 1, 2 and 3 are plan and cross-section views respectively of an embodiment of the zener diode according to the invention; and FIG. 4 is a graphical representation of the doping concentration profile below the facing surface of the device according to the invention.

DESCRIPTION

An embodiment of a zener diode as fabricated according to the invention is shown in FIGS. 1, 2 and 3. This depiction, in the interest of clarity, is that of an idealized structure. FIG. 1 is a plan view and is much in the way of superimposed mask outlines as used in a conventional CMOS fabrication process. FIGS. 2 and 3 are cross-section views taken at the lines 2—2 and 3—3 respectively and again in the interest of clarity, are much in the way of vertical projections of the mask outlines. Those skilled in the art will recognize the advantages of this particular depiction and immediately will correlate with the configuration as actually realized. The zener diode according to the invention and other electronic semiconductor components and circuitry used therewith are assembled on a body of semiconductor material or substrate 10. As shown, the substrate 10 is a wafer of substantially pure silicon doped with a negative dopant of given concentration denoted here as n. In the fabrication of a conventional semiconductor electronic circuit wafer or chip, the zener diode structure according to the invention will be laid down in a sequence of steps which will be the same sequence of steps as for other transistor devices and semiconductor circuit components according to the invention as those skilled in the art will readily determine. In conventional manner, a quantity of semiconductor material of opposite conductivity type denoted here as p+, is deposited on the substrate 10 and diffused therein for forming a conventional "p-well" 12 to a predetermined depth from the facing surface of the substrate 10. This p-well 12 is generally of elongated rectangular shape and is diffused in the same step as for an N-channel FET. The next step in this sequence of steps for the zener diode structure is a simultaneous diffusing of enhanced semiconductor material of the first semiconductor conductivity type, shown here as n+ type, in two elongated regions 14 and 16 spaced apart from the first region 12 and penetrating to a prearranged depth of the order of two-thirds of the predetermined depth of the well. Centrally located diffusion 18 of p+ material is diffused into the p-well 12 to a depth of the same order as the prearranged depth of the two regions 14 and 16 previously mentioned. A layer of n+ material is deposited, preferably by ion implantation, between the regions 14 and 16, over the central diffusion region 18 and over part of the p-well 12 to a depth of the order of one-fourth of the predetermined depth. The upper part of the region 18 resulting from the centrally located diffusion is converted from the diffused p+ material to a diffused n+ region of semiconductor material of the opposite conductivity type, and the zener diode pn junction is located at the contiguous areas between the p+ region 18 and the n+ region 20. This area is large whereby the current density is relatively low. The entire p+n+ junction is completely beneath the facing surface 11.

While those skilled in the art will fabricate zener diode structures according to the invention in terms of dimension with which they are familiar, some typical dimensions are listed in Table I below.

TABLE I

| | |
|---|---|
| Substrate 10 (depth-1.5 mm) | 1150 microns |
| Cathode region 20 (depth at zener junction) | 0.5 micron |
| Anode region 12 (depth below surface) | 1.5 microns |
| Well 12 (at surface) | 36 × 10 microns |
| Cathode region 20 (at surface) | 26 × 26 microns |
| Anode region 18 (at zener junction) | 20 × 20 microns |

Zener diodes according to the description above have been made with the concentrations given in Table II below.

TABLE II

| | |
|---|---|
| Substrate 10 arsenic doped Silicon | $10^{15}/cm^3$ p− |
| Anode regions 18 Boron dopant | $10^{17}/cm^3$ p |
| Cathode region 20 Arsenic dopant | $10^{20}/cm^3$ n+ |

It should be understood that those skilled in the art will fabricate the zener diode according to the invention with the opposite conductivity by interchanging p material for n material and the converse by ion implantation rather than diffusion without otherwise departing from the teaching herein.

FIG. 4 is a graphical representation of the doping concentration as related to depth below the facing surface of the CMOS IC device according to the invention. The curve 50 represents the substrate concentration reference level. The curve 52 represents a profile down the center of the p-well. The curve 54 represents a p+ profile, while the curve 56 represents an n+ profile. The avalanche breakdown occurs at the concentrations represented by the crossover point 58.

While the invention has been described in terms of and express embodiment, and alternatives have been suggested, it is clearly to be understood that those skilled in the art will effect further changes in form and in substance without departing from the spirit and scope of the invention as defined in the appended claims concluding the specification.

The invention claimed is:

1. A subsurface breakdown zener diode in a complimentary metal oxide semiconductor integrated circuit structure comprising,
   a semiconductor body of the first conductivity type material,
   a diffused region of a second conductivity type material formed from the surface of said semiconductor body to a predetermined depth in said body,
   a diffused anode region of enhanced material of said second conductivity type material formed centrally in said diffused region from the surface to a depth less than said predetermined depth,
   regions of enhanced material of said first conductivity type diffused in the surface of said semiconductor body at either side of the first said diffused region, and
   a further region comprising a layer of the same enhanced material of said first conductivity type diffused over said diffused anode region and constituting a cathode region and interconnecting said regions of enhanced material of said first conductivity type.

2. A subsurface breakdown zener diode as defined in claim 1, wherein said first conductivity type material is n type and said second conductivity type material is p type.

3. A subsurface breakdown zener diode as defined in claim 1, and wherein
   said diode presents a relatively low dynamic impedence between said anode and said cathode regions.

4. A subsurface breakdown zener diode assembly in a complimentary metal oxide semiconductor integrated circuit structure comprising
   a semiconductor body of a first conductivity type material having a facing surface,
   an elongated region of a second conductivity type having given length and breadth diffused from said facing surface to a predetermined depth into said body,
   a central region of enhanced material of said second conductivity type diffused from said facing surface into said elongated region centrally thereof to a prearranged depth less than said predetermined depth,
   a pair of elongated regions of enhanced material of said first conductivity type arranged on either side of and spaced from said elongated region of said second conductivity type extending on either side of said central region and for less than the length of said elongated region and diffused into said body to a depth of the order of said prearranged depth,
   another region of enhanced material of said first conductivity type ion implanted between said pair of elongated regions from said facing surface into said body, into said elongated region centrally thereof, and into said central region of said second conductivity type to a depth at which a junction of said first and second conductivity type materials is established below said facing surface, and
   one contact electrode deposited on one of said pair of regions of said first conductivity type and another contact electrode deposited on said elongated region of said second conductivity type beyond the region of said ion implanted material.

5. A subsurface breakdown zener diode assembly as defined in claim 4, and wherein
   said first conductivity type is n type,
   said second conductivity type is p type,
   said one contract is an anode contact, and
   said other contact is a cathode contact.

6. A subsurface breakdown zener diode assembly in a complimentary metal oxide semiconductor integrated circuit structure comprising,
   a semiconductor body of a first conductivity type having a facing surface,
   a well of semiconductor material of a second conductivity type diffused from said facing surface into said body to a predetermined depth,
   a body of enhanced semiconductor material of said second conductivity type diffused centrally of said well to a prearranged depth from said facing surface less than said predetermined depth,
   an electric contact made at said surface to said well outside said body,
   a pair of regions of enhanced semiconductor material of said first conductivity type arranged on either side of and spaced from said well and diffused into said body to a depth from said facing surface of the order of said prearranged depth,
   an implanted region of enhanced semiconductor material of said first conductivity type bridging the gap between said pair of regions over said body, leaving said electric contact uncovered, and contacting said body completely beneath said facing surface, and
   another electric contact made to one region of said pair of regions.

* * * * *